(12) United States Patent
Chen et al.

(10) Patent No.: US 8,007,864 B2
(45) Date of Patent: Aug. 30, 2011

(54) METHOD FOR FORMING METALLIC NANOWIRES

(75) Inventors: In-Gann Chen, Tainan (TW);
Jenn-Ming Song, Tainan (TW);
Hsien-Tse Tung, Hsichih (TW)

(73) Assignee: National Cheng Kung University (TW)

( * ) Notice: Subject to any disclaimer, the term of this patent is extended or adjusted under 35 U.S.C. 154(b) by 868 days.

(21) Appl. No.: 11/969,675

(22) Filed: Jan. 4, 2008

(65) Prior Publication Data

US 2010/0285215 A1    Nov. 11, 2010

(30) Foreign Application Priority Data

Mar. 28, 2007    (TW) ................................ 96110807 A

(51) Int. Cl.
*B05D 3/02*    (2006.01)
(52) U.S. Cl. ........................................ 427/229; 427/226
(58) Field of Classification Search .................... 427/229
See application file for complete search history.

(56) References Cited

U.S. PATENT DOCUMENTS 7,265,037 B2 *    9/2007    Yang et al. .................... 438/497
7,381,367 B1 *    6/2008    Baker et al. ........................ 419/2
2008/0079104 A1 *    4/2008    Stewart et al. ................ 257/433

OTHER PUBLICATIONS

Chen et al., "Thermal-induced formation of silver nanowires on titanium dioxide thin films," J. Vac. Sci. Tech. B 23(6), pp. 2261-2265 (2005).*

* cited by examiner

*Primary Examiner* — Michael Cleveland
*Assistant Examiner* — Robert Vetere
(74) *Attorney, Agent, or Firm* — Choate, Hall & Stewart, LLP

(57) ABSTRACT

A method for forming well-aligned metallic nanowires includes: (a) providing a substrate formed with a crystal layer thereon; (b) disposing the substrate in such a manner that the crystal layer faces downwardly; (c) applying a metal salt solution, which contains metal ions therein, to the crystal layer on the substrate; and (d) subjecting the metal ions in the metal salt solution on the crystal of TiO2 layer to a reduction treatment, thereby resulting in reduced metal that grows downward toward earth's gravity.

11 Claims, 4 Drawing Sheets

METHOD FOR FORMING METALLIC NANOWIRES

CROSS-REFERENCE TO RELATED APPLICATION

This application claims priority of Taiwanese application no. 096110807, filed on Mar. 28, 2007.

BACKGROUND OF THE INVENTION

1. Field of the Invention

This invention relates to a method for forming oriented metallic nanowires, more particularly to a method involving growing metallic nanowires by reduction reaction of metal salt solutions in a downward direction toward earth's gravity.

2. Description of the Related Art

Conventional methods for forming metallic nanowires include the template synthesis method, the seed-mediated growth method, and the thermal-induced forming method.

In the template synthesis method, a porous material, such as anodic alumina membrane (AAM), $SiO_2$ and zeolite, formed with a plurality of nano-sized pores therein is used as a template such that metallic nanowires are grown in the nano-sized pores. Formation of the metallic nanowires in the nano-sized pores can be conducted through soft chemical solution, sol-gel or electroplating techniques. The template synthesis method is disadvantageous in that the cost of the template is relatively expensive. In addition, the number and length of the metallic nanowires thus formed are limited by the nanostructure of the template.

In the seed-mediated growth method (Adv. Mater. 2002, 14, No. 1, January 4, p. 80~82), metal ions in a metal salt solution are reduced using a strong reducing agent so as to form seeds, i.e., nucleation sites, each having a diameter of 3-5 nm. The metal salt solution containing the seeds is then added into another solution, which contains a high concentration of the metal salt, a weak reducing agent and a rodlike micellar template, for subsequent steps of forming the metallic nanowires. However, the seed-mediated growth method is relatively complex and has a poor control in growing the metallic nanowires.

In the thermal-induced forming method (J. Vac. Sci Technol. B 23 (6), November/December 2005, p. 2261~2265), a $TiO_2$ film is formed on a Si substrate, followed by applying a metal salt solution, such as $AgNO_3$ solution, on the anatase-$TiO_2$ film. Electrons and electron holes are formed on a surface of $TiO_2$ films by exposure to ultraviolet (UV) light. The metal ions are trapped by the excited electrons, which results in the reduction of metal ions to atoms. Heating at 300° C.-500° C. provides thermal energy to overcome the energy barrier to allow reduction metal ions and accumulation of atoms. Although the thermal-induced forming method is simple and cost effective, the metallic nanowires thus formed are randomly oriented.

SUMMARY OF THE INVENTION

Therefore, an object of the present invention is to provide a method for forming metallic nanowires that can overcome the aforesaid drawbacks associated with the prior art.

According to an embodiment of the present invention, a method for forming metallic nanowires comprises: (a) providing a substrate formed with a crystal layer thereon; (b) disposing the substrate in such a manner that the crystal layer faces downwardly; (c) applying a metal salt solution, which contains metal ions therein, to the crystal layer of the substrate; and (d) subjecting the metal ions in the metal salt solution on the crystal layer to a heating reduction treatment, thereby resulting in reduced metal that grows downward toward earth's gravity.

BRIEF DESCRIPTION OF THE DRAWINGS

Other features and advantages of the present invention will become apparent in the following detailed description of the preferred embodiment of this invention, with reference to the accompanying drawings, in which.

DETAILED DESCRIPTION

Figure 1:
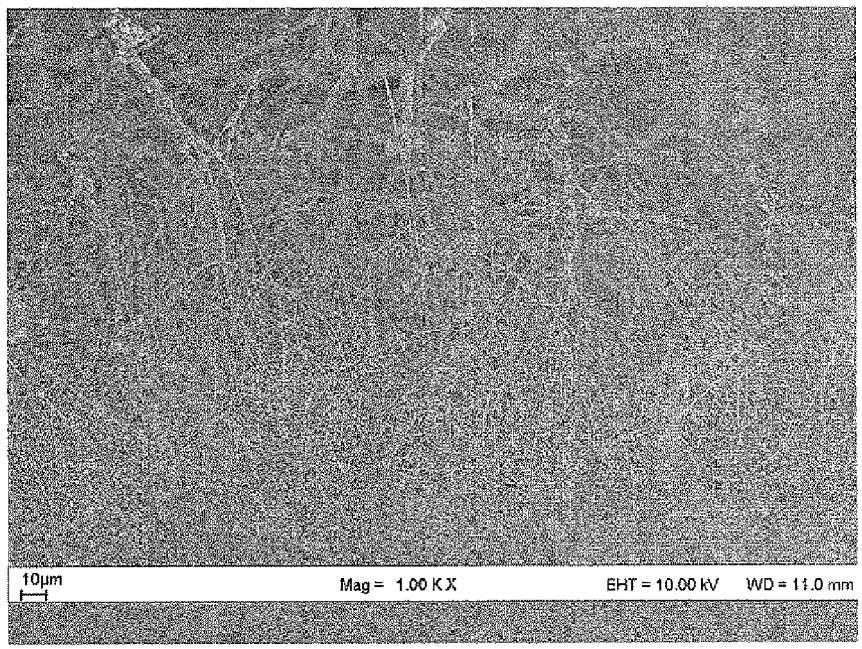
FIG. 1 is a scanning electron microscopic view of copper nanowires of Example 1 formed by a method embodying this invention.

This invention relates to a method for forming metallic nanowires. The method includes: (a) providing a first substrate formed with a crystal layer thereon; (b) disposing the first substrate in such a manner that the crystal layer faces downwardly; (c) applying a metal salt solution, which contains metal ions therein, to the crystal layer of the first substrate; and (d) subjecting the metal ions in the metal salt solution on the crystal layer to a heating reduction treatment, thereby resulting in reduced metal that grows downward toward earth's gravity.

In some embodiments, the crystal layer is made from a material having hydrophilic and photocatalytic properties. In one or more of these embodiments, the crystal layer has a crystal form of anatase.

In some of these embodiments, the reduction of the metal ions in step (d) is conducted through heating and under a condition such that the metal salt solution on the crystal layer is exposed to a gaseous environment. In one embodiment, the gaseous environment is atmospheric air. In some embodiments, the heating temperature ranges from 100° C. to 350° C., and the reaction time is 1 to 3 hours.

In one embodiment, the method further includes providing a second substrate disposed below the first substrate and sandwiching the metal salt solution between the first and second substrates so as to enhance uniformity in growing the nanowires.

It is noted that, when a distance between the first and second substrates is relatively small, the reduced metal tends to form into large size particles adhered to both of the first and second substrates. In some embodiments, the metal salt solution applied to the first substrate has a layer thickness greater than 1 mm, and the distance between the first and second substrates ranges from 1 mm to a value that is sufficient to permit the metal salt solution to contact each of the first and second substrates.

In one embodiment, the second substrate is made from Si and is formed with a $TiO_2$ layer.

In some embodiments, the metal salt solution contains a water-soluble metal salt selected from the group consisting of a copper salt, a silver salt, a gold salt, and combinations thereof. In this embodiment, the metal salt is selected from the group consisting of $CuCl_2$, $Cu(NO_3)_2$, $Cu(C_2H_3O_2)$, $AgNO_3$, $HAuCl_4$, and combinations thereof.

In one embodiment, the metal salt solution has a concentration ranging from 0.05 M to 0.2 M.

The merits of the method for forming metallic nanowires of this invention will become apparent with reference to the following Examples and Comparative Example.

EXAMPLES

Example 1

The metallic nanowires of Example 1 were prepared by the following steps.

A Si substrate was placed inside a magnetron sputtering system. A feed gas including argon and oxygen was introduced into the system at a 3:7 flow rate ratio to maintain a working pressure of $1.59 \times 10^{-2}$ torr. After applying an output power of 300 W on a Ti target in the magnetron sputtering system, a $TiO_2$ film was formed on the Si substrate. Subsequently, the $TiO_2$ film was heated to a working temperature of 500° C. for 8 hours at a raising rate of 5° C./min so as to obtain a crystal form of anatase of $TiO_2$ film on the Si substrate. After applying about 15 μL of 0.1 M $CuCl_2$ solution on a 1 cm$^2$ area of the $TiO_2$ film thus formed, the $TiO_2$ film was placed in an oven, and was disposed such that the same faced downwardly. The oven was heated to a working temperature of 300° C. for 2 hours at a raising rate of 5° C./min. Cu nanowires formed on the $TiO_2$ film were obtained and had an average width of about 100 nm and an average length of about hundreds of micrometers.

Figure 2:
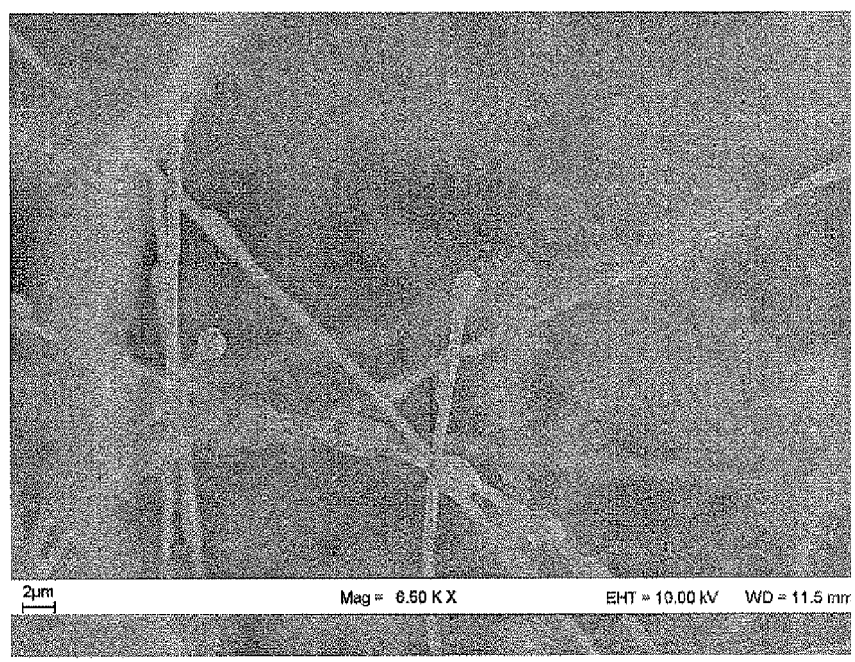
FIG. 2 is an enlarged scanning electron microscopic view of FIG. 1.

FIG. 1 is a scanning electron microscope (SEM) image showing the Cu nanowires at 1000× magnification and FIG. 2 is an enlarged image of FIG. 1 at 6500× magnification.

Example 2

The metallic nanowires of Example 2 were prepared according to steps similar to those of Example 1, except that this example further utilized a second Si substrate formed with a $TiO_2$ layer thereon. In this example, after application of the metal salt solution on the first Si substrate, two spacers made from quartz and having a height of about 2 mm were disposed on the first Si substrate, and the second Si substrate was then disposed on the spacers such that the $TiO_2$ layers of the first and second substrates faced toward each other, thereby confining and spreading the metal salt solution therebetween.

Figure 3:
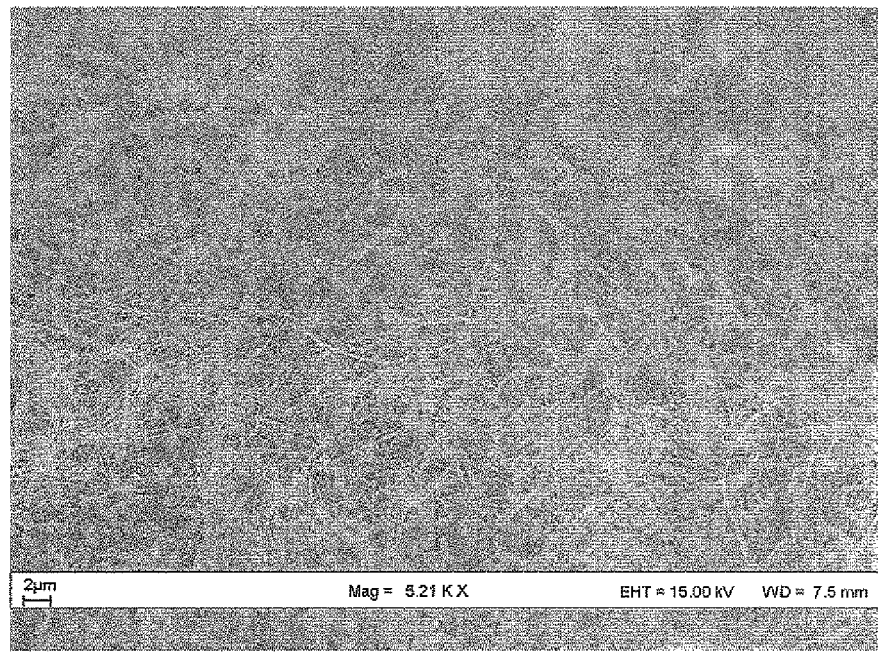
FIG. 3 is a scanning electron microscopic view of copper nanowires of Example 2 formed by an embodiment of a method of this invention.

FIG. 3 is a scanning electron microscope (SEM) image showing the Cu nanowires at 5210× magnification. The Cu nanowires thus formed had an average width of about 100 nm and an average length of about hundreds of micrometers.

Example 3

The metallic nanowires of Example 3 were prepared according to steps similar to those of Example 2, except that the metal salt solution is $AgNO_3$ solution.

Figure 4:
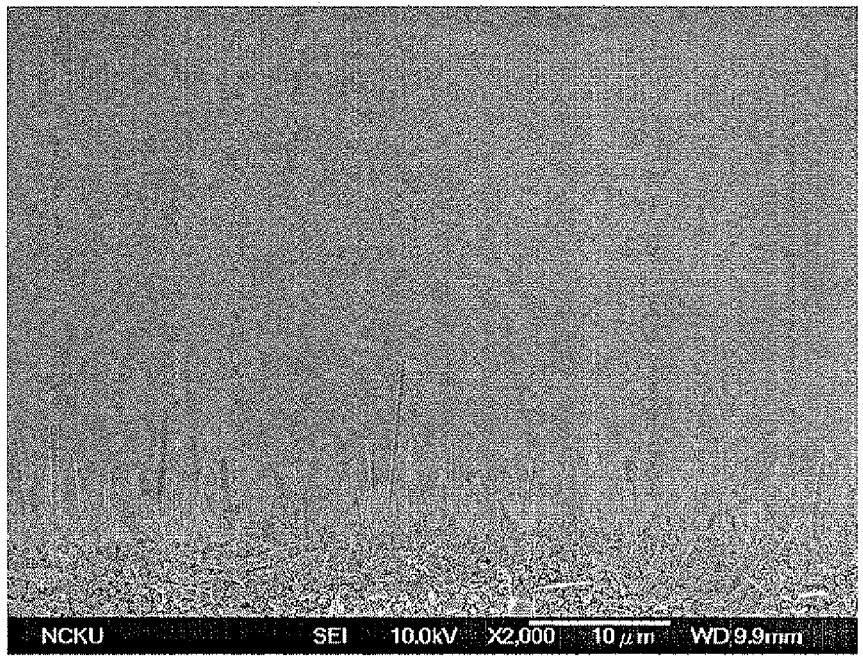
FIG. 4 is a scanning electron microscopic view of silver nanowires of Example 3 formed by an embodiment of a method of this invention.
Figure 5:
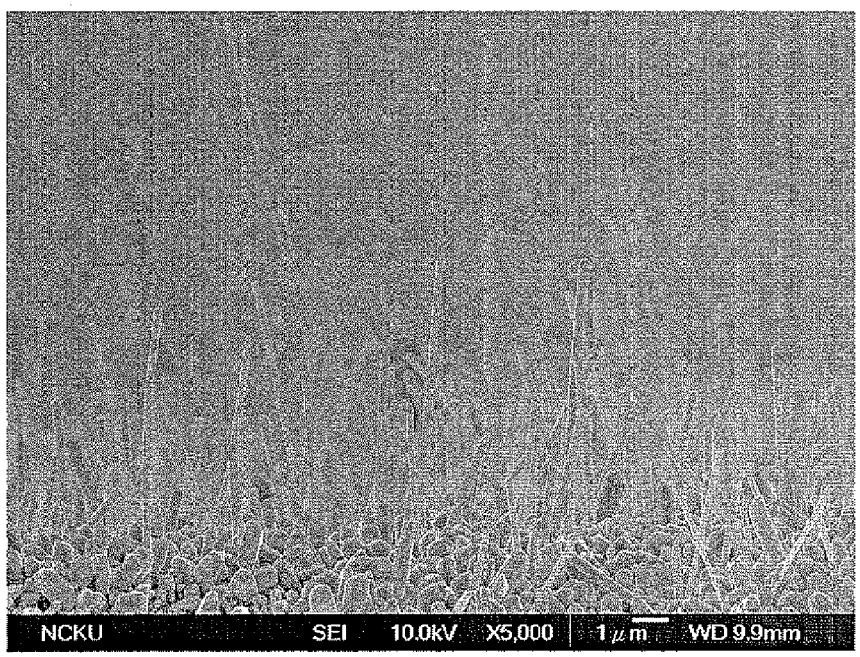
FIG. 5 is an enlarged scanning electron microscopic view of silver nanowires of Example 3.

FIGS. 4 and 5 are scanning electron microscope (SEM) images showing the Ag nanowires at 2000× and 5000× magnification, respectively. The Ag nanowires thus formed had an average width of about 100 nm and an average length of about tens of micrometers.

Example 4

The metallic nanowires of Example 4 were prepared according to steps similar to those of Example 2, except that the metal salt solution is $HAuCl_4$ aqueous solution.

Figure 6:
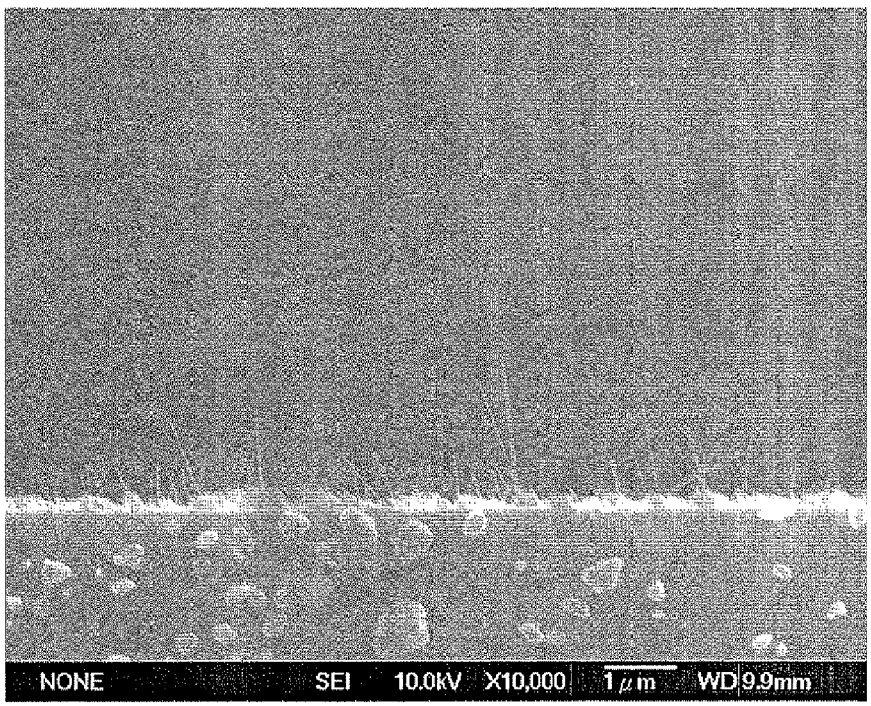
FIG. 6 is a scanning electron microscopic view of gold nanowires of Example 4 formed by an embodiment of a method of this invention.

FIG. 6 is a scanning electron microscope (SEM) image showing the Au nanowires at 10000× magnification. The Au nanowires thus formed had an average width of less than 100 nm and an average length of about several micrometers.

Comparative Example 1

The metallic nanowires of Comparative Example 1 were prepared according to steps similar to those of Example 3, except that the $TiO_2$ film was disposed such that the same faced upwardly in the oven, i.e., the reduced metal grew in an upward direction opposite to the earth's gravity.

Figure 7:
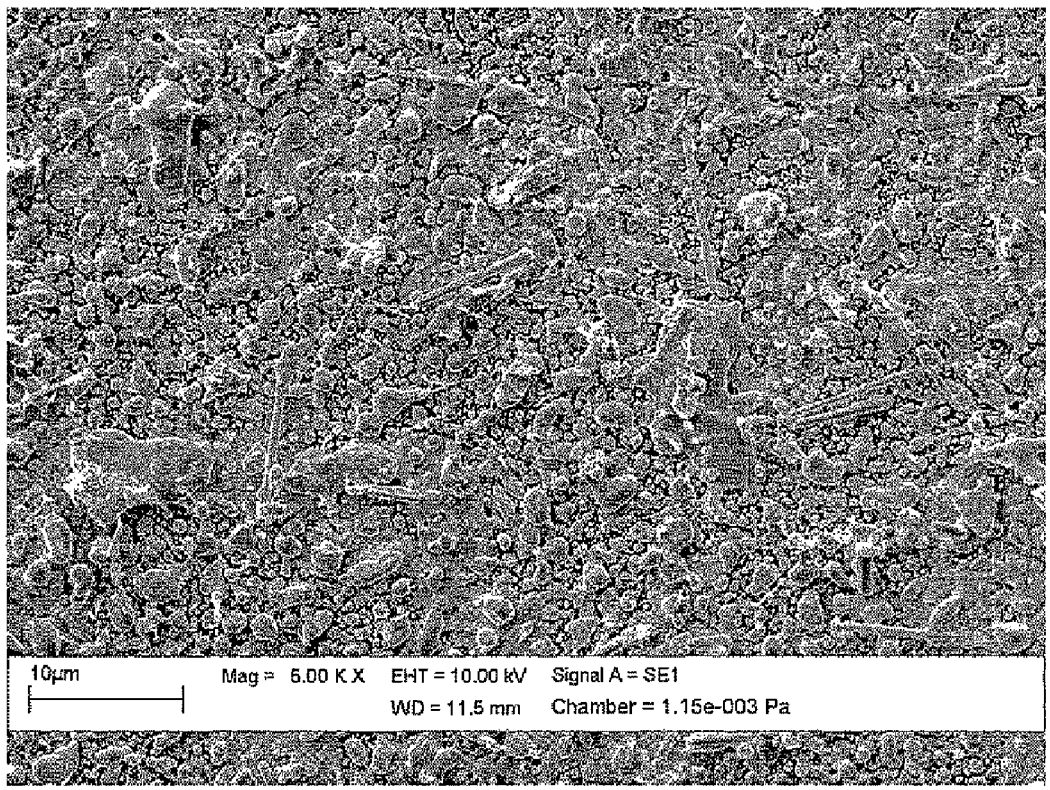
FIG. 7 is a scanning electron microscopic view of silver nanowires of Comparative Example 1 formed by the conventional thermal-induced forming method.

FIG. 7 is a scanning electron microscope (SEM) image showing the Ag nanowires thus formed at 5000× magnification. The result shows that scarce Ag nanowires were formed in the Comparative Example.

Comparing each of Examples 1-4 (FIGS. 1-6) to Comparative Example 1 (FIG. 7), the metallic nanowires formed in each Example far outnumber the metallic nanowires formed in the Comparative Example. Hence, by allowing the reduced metal to grow downward toward earth's gravity, dense metallic nanowires can be obtained.

With the invention thus explained, it is apparent that various modifications and variations can be made without departing from the spirit of the present invention. It is therefore intended that the invention be limited only as recited in the appended claims.

What is claimed is:

1. A method for forming metallic nanowires, comprising:
   (a) providing a first substrate formed with a crystal layer thereon;
   (b) disposing the first substrate in such a manner that the crystal layer faces downwardly;
   (c) applying a metal salt solution, which contains metal ions therein, to the crystal layer on the first substrate;
   (d) providing a second substrate disposed below the first substrate and sandwiching the metal salt solution between the first and second substrates; and
   (e) subjecting the metal ions in the metal salt solution on the crystal layer to a heating reduction treatment, thereby resulting in reduced metal that grows downward toward earth's gravity.

2. The method of claim 1, wherein the crystal layer is made from a material having hydrophilic and photocatalytic properties.

3. The method of claim 2, wherein the crystal layer has a crystal form of anatase.

4. The method of claim 1, wherein the reduction of the metal ions in step (e) is conducted through heating.

5. The method of claim 4, wherein the heating temperature in step (e) ranges from 100° C. to 350° C.

6. The method of claim 1, wherein a distance between the first and second substrates ranges from 1 mm to a value that is sufficient to permit the metal salt solution to contact each of the first and second substrates.

7. The method of claim 1, wherein the second substrate is made from Si and is formed with a $TiO_2$ layer thereon.

8. The method of claim 1, wherein the metal salt solution contains a water-soluble metal salt selected from the group consisting of a copper salt, a silver salt, a gold salt, and combinations thereof.

9. The method of claim 8, wherein the metal salt is selected from the group consisting of $CuCl_2$, $Cu(NO_3)_2$, $Cu(C_2H_3O_2)$, $AgNO_3$, $HAuCl_4$, and combinations thereof.

10. The method of claim 8, wherein the metal salt solution has a concentration ranging from 0.05M to 0.2M.

11. The method of claim 1, wherein the reduction in step (e) is conducted under a condition such that the metal salt solution on the crystal layer is exposed to a gaseous environment.

* * * * *